United States Patent [19]

Bondur et al.

[11] Patent Number: 4,832,787
[45] Date of Patent: May 23, 1989

[54] GAS MIXTURE AND METHOD FOR ANISOTROPIC SELECTIVE ETCH OF NITRIDE

[75] Inventors: James A. Bondur, Walden, N.Y.; Francois D. Martinet, Boissise Le Roi, France

[73] Assignee: International Business Machines Corporation, Armonk, N.Y.

[21] Appl. No.: 157,762

[22] Filed: Feb. 19, 1988

[51] Int. Cl.$^4$ .............. B44C 1/22; C03C 15/00; C03C 25/06
[52] U.S. Cl. .................. 156/643; 156/646; 156/653; 156/657; 156/659.1; 204/192.37; 252/79.1; 437/241
[58] Field of Search ............. 156/643, 646, 653, 657, 156/659.1, 662; 427/38, 39; 204/192.32, 192.35, 192.37; 437/241, 242; 252/79.1

[56] References Cited

U.S. PATENT DOCUMENTS

| | | | |
|---|---|---|---|
| 3,951,709 | 4/1976 | Jacob | 252/79.2 X |
| 4,352,724 | 10/1982 | Sugishima et al. | 204/192.37 |
| 4,374,698 | 2/1983 | Sanders et al. | 156/643 |
| 4,474,642 | 10/1984 | Nakane et al. | 156/643 |

OTHER PUBLICATIONS

Beinvogl et al., "Reactive Ion Etching of Polysilicon and Tantalum Silicide", Solid State Technology, Apr. 1983, pp. 125–130.

Primary Examiner—William A. Powell
Attorney, Agent, or Firm—William T. Ellis

[57] ABSTRACT

A gas mixture for use in the selective dry etching of a nitride insulator layer relative to an oxide insulator layer comprising: a gas mixture containing chlorine and oxygen. The oxygen in this gas mixture must comprise 15% or less by volume.

In a preferred process embodiment for etching $Si_3N_4$ and leaving a layer of $SiO_2$ therebelow, $Cl_2$ gas may be used in combination with 12% or less oxygen by volume. Etch selectivity of greater than five to one is achieved with this gas mixture when a plasma RF frequency of less than 1 MHz is utilized. When a high frequency RF component in the range of 10–27 MHz is added to the RF excitation signal, then an etch uniformity of better than 3% is achieved.

20 Claims, 1 Drawing Sheet

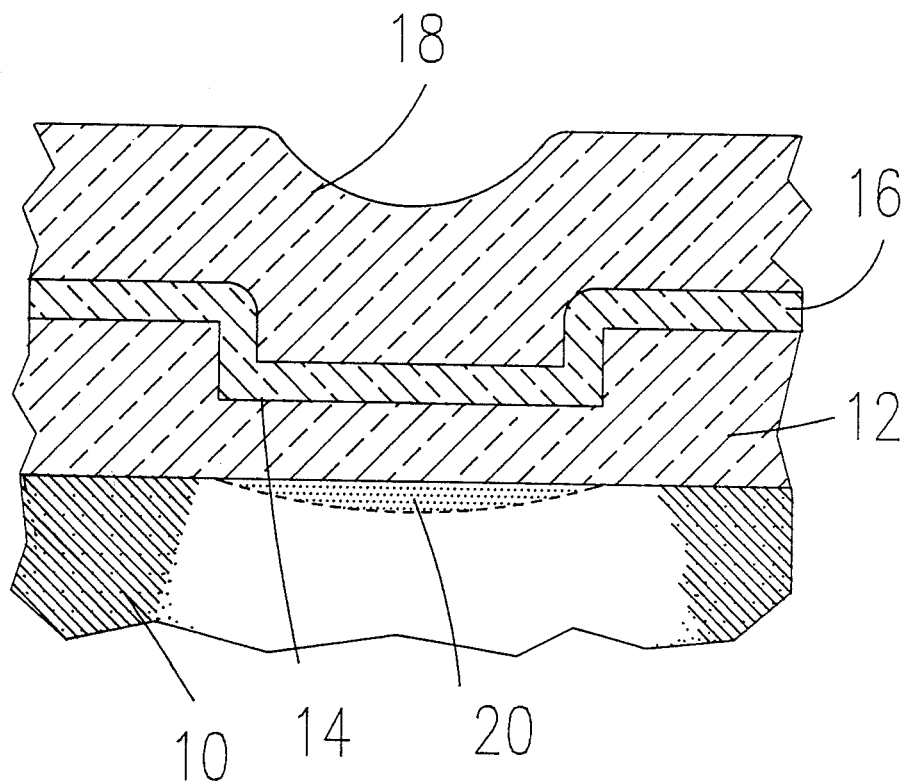

GAS MIXTURE AND METHOD FOR ANISOTROPIC SELECTIVE ETCH OF NITRIDE

BACKGROUND OF THE INVENTION

The present invention relates generally to dry etch gas mixtures and plasmas, and more particularly to a dry etch gas mixture and plasma for selectively etching a nitride insulator layer relative to an oxide insulator layer.

In semiconductor chip processing technology, a common insulation structure comprises a layer of a nitride disposed in adjacency with a layer of oxide. There are many processing sequences that require the etching out of the nitride at a particular location with the etch leaving an even and essentially full layer of oxide therebelow. This nitride selectivity over oxide requirement is especially critical for processing contact openings during the formation of transistors.

For example, the FIGURE illustrates a structure that may be used in the formation of a transistor. The structure comprises a silicon bulk area 10, a first layer 12 of $SiO_2$ disposed over the silicon bulk area 10 and including a reduced thickness area or step 14. The structure further comprises a conformal second layer 16 of $Si_3N_4$ disposed over the $SiO_2$ layer 12, and a conformal thick layer 18 of some form of insulator, such as glass, disposed over layer 16. At the point in the process shown in the FIGURE, an undiffused base dopant 20 is present in a selected area of the silicon bulk below the step area 14 of the $SiO_2$ layer 12. It is essential that the dopant layer 20 not be penetrated at this point in the process. However, the glass insulator 18 and the $Si_3N_4$ in the step area 14 must be removed down to the $SiO_2$ layer 12 in order to facilitate further process steps. The first step in this etching removal process is to remove the conformal glass insulation layer 18 in the region above the step 14. But, due to the uneven topography of the glass insulation 18 over the step area 14, a predetermined overetch of the glass 18 into the $Si_3N_4$ layer 16 is required to remove all of the glass 18 above the step area 14. This overetch results in an uneven $Si_3N_4$ topography. Such topography requires a highly selective etch mixture which will etch through the $Si_3N_4$, but will stop at the $SiO_2$ layer 12. Such an etch gas mixture must also have etch homogeneity and good endpoint control.

Most current recipes for the selective etching of a nitride layer in preference to an oxide layer utilize a fluoro carbon gas, either in the plasma mode (high pressure parallel plates or a barrel etcher) or in an afterglow discharge mode via microwave excitation. A typical mixture might comprise $CF_4$ in 50-95% oxygen. The problem with these etch processes are (1) the etches are isotropic; (2) Polymer formation on the $Si_3N_4$ surfaces from the previous oxide etch step interferes with the etch uniformity; and (3) $Si_3N_4$ over-etching is limited because of the low $Si_3N_4$-$SiO_2$ ERR (usually less than 2:1).

The invention as claimed provides a gas mixture and plasma which achieves a selectivity with anisotropic etching of on the order of five to one or greater. Additionally, an etch uniformity for the nitride layer of better than 3% is achieved and the process has excellent repeatability.

SUMMARY OF THE INVENTION

Briefly, the present invention comprises a gas mixture for use in the selective dry etching of a nitride insulator layer relative to an oxide insulator layer, comprising:
a carrier gas containing chlorine; and
oxygen;
wherein the oxygen comprises no more than 1-15% by volume of the gas mixture.

In a preferred embodiment of the present invention, the oxygen comprises less than 12% of the gas mixture and the carrier gas containing chlorine comprises $Cl_2$. The gas mixture may further include a non-reactive gas. A typical non-reactive gas which might be utilized is argon.

The invention further comprises an RF gaseous plasma for use in the selective dry etching of a nitride insulator layer relative to an oxide insulator layer, comprising:
chlorine species; and
oxygen;
wherein the oxygen comprises no more than 15% by volume of the plasma.

The invention further comprises a process for selectively etching a nitride insulator relative to an oxide insulator layer, comprising the steps of:
exposing the nitride layer to a low frequency (less than 1 MHz) gaseous RF plasma that includes chlorine species, wherein the plasma is formed from a mixture of a gas containing oxygen in the range of 1-15% by volume. The etching chamber pressure should be greater than 0.4 Torr.

In a preferred embodiment, this process further includes the step of generating the RF gaseous plasma using a dual RF power source which operates with a high power (120W-1000W) low frequency signal in the range of 300-900 kHz, and with a lower power (less than 70 W) high frequency signal (13.56 MHz or greater) superimposed on it.

BRIEF DESCRIPTION OF THE DRAWINGS

The FIGURE is a cross-section of a contact opening area in a semiconductor chip.

DETAILED DESCRIPTION OF THE PREFERRED EMBODIMENT

It has been discovered that unusually high selectivity in the dry etching of a nitride insulator layer relative to an oxide insulator layer is obtained in a dry etching chamber utilizing a gas mixture containing a carrier gas including chlorine and oxygen. In this mixture the oxygen comprises no more than 1-15% by volume. The precise amount of oxygen added in this 1-15% range will depend on the mask composition and the mask pattern factor, i.e., the loading. The RF gaseous plasma which results from the use of the this gas mixture comprises a chlorine species, and oxygen, wherein the oxygen comprises no more than 15% by volume of the plasma. Typical chlorine species in this plasma will be $Cl_2^{++}$ and $Cl^+$.

It is theorized that unusual selectivity is obtained because the oxygen addition alters the balance between the halogen atoms and the unsaturates, and the oxygen acts to consume preferentially $CCl_x$ species. These $CCl_x$ species are responsible for oxide etching in the plasma. It has been found that by adding amounts of oxygen in the range of 1-15% by volume, both the etch rate for the nitride and the oxide fall, but the etch rate for the oxide falls much faster than expected, thereby providing a high selectivity. This unusual selectivity was achieved for chlorine glow discharge etching at a low frequency of less than 1 MHz, and preferably in the range of 300–900 kHz and with an RF power of at least 120 W, and preferably in the range of 120 W–1000 W, of a layer of $Si_3N_4$ disposed over a thin layer of $SiO_2$. This etch reactor selectivity was at least 5 to 1. The etch reactor pressure was greater than 0.4 Torr for these experiments. It was found that the repeatability of this etch selectivity was excellent and that the etch process could be controlled by either time or by optical endpoint detection at 386 nm (the wavelength line for $Cl_2^+$).

Additionally, it was found that if a low power RF signal of less tha 70 W (preferably less than 50 W) at a high frequency of at least ten times greater than the low frequency component noted above, and preferably greater than the 10 MHz (with a preferred range of 13–27 (MHz) is superimposed on the low frequency RF signal, then the etch rate uniformity variation was found to be less than 3% ($3\sigma/x$) on a 125 mm wafer.

It was further determined that by increasing the volume of oxygen in the gas mixture above 15%, the nitride selectivity over the oxide was significantly degraded. In particular, oxide deposition began to occur above 15% oxygen. It was also determined that the nitride selectivity was degraded when the low frequency RF excitation was removed from the plasma.

It may be desirable to add a non-reactive gas such as, for example, argon, in order to dilute the mixture to control the reaction rate of $Cl_2$ in the plasma and further to improve the heat transfer uniformity of the plasma. The addition of Argon improves the uniformity of the etch reaction on both large and small wafers.

This process may be used to selectively etch a nitride relative to an oxide in an unlimited number of process applications. It has been found that no measurable deposition occurs during this process as long as the oxygen content of the gas mixture is maintained below 15%.

In addition to chlorine gas, a number of chlorine gas carriers may be utilized to form the gas mixture including Freon 11, $CCl_4$ and Freon 12.

The disclosed gas mixture, plasma, and process provides an unexpectedly high selectivity of nitride etching over oxide relative to existing processes and an excellent wafer etch uniformity and run-to-run repeatability. In particular, the present gas mixture and process achieves a selectivity with anisotropic etching of greater than 5 to 1 versus 2 to 1 for high frequency (13.56 MHz, for example) $CF_4/O_2$ isotropic processes. The etching uniformity achieved on a nitride layer is better than 3% when a dual frequency RF excitation is used, compared to greater than 9% on $CF_4$ processes. Moreover, standard endpoint detection by optical emission spectroscopy may be utilized with this process.

Accordingly, the present gas mixture and process is ideal for contact opening processes where the etching is required to stop on a thin oxide layer.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. A gas mixture for use in the selective dry etching of a nitride insulator layer relative to an oxide insulator layer, comprising:
   a gas mixture containing at least 70% by volume of chlorine; and oxygen;
   wherein said oxygen comprises no more than 1–15% by volume of said gas mixture.
2. A gas mixture as defined in claim 1, wherein said oxygen comprises less than 12% of said gas mixture.
3. A gas mixture as defined in claim 1, further comprising a non-reactive gas.
4. A gas mixture as defined in claim 3, wherein said non-reactive gas is argon.
5. A gas mixture as defined in claim 1, wherein said chlorine containing gas is $Cl_2$.
6. A gas mixture for use in the selective dry etching of a silicon nitride insulator layer relative to a silicon dioxide insulator layer, comprising:
   $Cl_2$ gas, wherein said $Cl_2$ gas is at least 70% by volume of said gas mixture;
   oxygen, wherein said oxygen comprises no more than 12% by volume of said gas mixture.
7. An RF gaseous plasma for use in the selective dry etching of a nitride insulator layer relative to an oxide insulator layer, comprising:
   chlorine species comprising at least 70% by volume of said plasma; and
   oxygen;
   wherein said oxygen comprises no more than 15% by volume of said plasma.
8. A plasma as defined in claim 7, wherein said oxygen comprises no more than 12% by volume of said plasma.
9. A plasma as defined in claim 8, further including a non-reactive gas.
10. A process for selectively etching a nitride insulator layer relative to an oxide insulator layer, comprising the steps of:
    disposing a nitride insulator layer to be etched in an etching chamber;
    exposing said nitride layer to a gaseous RF plasma that includes chlorine species, wherein said plasma is formed from a mixture of a gas containing oxygen in the range of 1–15% by volume, and using an RF excitation signal with the majority of power in the signal at a first frequency of less than 1 MHz.
11. A process as defined in claim 10, wherein said chamber pressure is greater than 0.4 Torr.
12. A process defined in claim 11, wherein said plasma exposing step comprises the step of forming said plasma with an RF frequency excitation including said first frequency signal with a frequency of less than said 1 MHz at a first power, and including a second frequency signal with a frequency at least 10 times greater than said first frequency signal and at a second power which is less than a half of said first power.
13. A process as defined in claim 12, wherein said first frequency signal has a first power in the range of at least 200 W and wherein said second frequency signal is greater than 10 MHz at a second power of less than 50 W.
14. A process as defined in claim 11, wherein said mixture in said exposing step contains no more than 12% by volume of oxygen.
15. A process as defined in claim 11, wherein said mixture in said exposing step includes a non-reactive gas.

16. A process as defined in claim 13, wherein said non-reactive gas is argon.

17. A process as defined in claim 10, wherein the chlorine-containing gas in said mixture in said exposing step comprises $Cl_2$ gas.

18. A process as defined in claim 12, comprising the step of generating said RF gaseous plasma with said first frequency signal being in the range of 300-900 kHz, with said second frequency signal being in the range of 13-27 MHz.

19. Process for selectively etching a nitride insulator layer relative to an oxide insulator layer, comprising the step of:

exposing said nitride layer to a gaseous plasma that includes chlorine species, wherein said plasma is formed from a gas mixture containing a gas in the range of 1-15% by volume that preferentially consumes $CCl_x$ species in said plasma, and wherein said plasma frequency signal includes a first frequency component in the range of 300-900 kHz and with a power of at least 120 W, and a second frequency component which is greater than 13 MHz and has a power of less than 50 W, and in an ambient pressure of greater than 0.4 Torr.

20. A process as defined in claim 19, further comprising the step of generating said gaseous plasma with said first frequency component in the range of 300-700 kHz.

* * * * *